(12) United States Patent
Voutsas (10) Patent No.: US 6,649,032 B2
(45) Date of Patent: Nov. 18, 2003

(54) SYSTEM AND METHOD FOR SPUTTERING SILICON FILMS USING HYDROGEN GAS MIXTURES

(75) Inventor: Apostolos Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 155 days.

(21) Appl. No.: 09/862,092

(22) Filed: May 21, 2001

(65) Prior Publication Data

US 2002/0171122 A1 Nov. 21, 2002

(51) Int. Cl.[7] .............................................. C23C 14/34
(52) U.S. Cl. ................... 204/192.23; 438/151; 438/764
(58) Field of Search ..................... 204/192.23; 438/151, 438/764

(56) References Cited

U.S. PATENT DOCUMENTS 5,723,034 A * 3/1998 Ohmi ..................... 204/192.23
6,261,877 B1 * 7/2001 Yamazaki et al. ........... 438/151

FOREIGN PATENT DOCUMENTS

JP        63-031175    * 2/1988 .................. 136/258

OTHER PUBLICATIONS

Article entitled, "Low–Temperature Polysilicon Thin–Film Transistors Fabricated from Laser–Processed Sputtered–Silicon Films", by Gary K. Giust et al., published in IEEE Electron Device Letters, vol. 19, No. 9, Sep. 1998, pp. 343–344.

Article entitled, "Laser–Processed Thin–Film Transistors Fabricated from Sputtered Amorphous–Silicon Films", by G. K. Giust & T. W. Sigmon, published in IEEE Transactions on Electron Devices, vol. 47, No. Jan. 1, 2000, pp. 207–213.

Article entitled, "Characteristics of Hydrogenated Amorphous Silicon Thin Film Transistors Fabricated by D.C. Magnetron Sputtering", by A. Kolodziej and S. Nowak, published in Thin Solid Films, 175 (1989) pp. 37–42.

* cited by examiner

Primary Examiner—Rodney G. McDonald
(74) Attorney, Agent, or Firm—David C. Ripma; Matthew D. Rabdau; Scott C. Krieger

(57) ABSTRACT

A method has been provided for forming a polycrystalline silicon (p-Si) film with a small amount of hydrogen. Such a film has been found to have excellent sheet resistance, and it is useful in the fabrication of liquid crystal display (LCD) panels made from thin film transistors (TFTs). The low hydrogen content polycrystalline silicon films are made from introducing a small amount of hydrogen gas, with Ar, during the sputter deposition of an amorphous silicon film. The hydrogen content in the film is regulated by controlling the deposition temperatures and the volume of hydrogen in the gas feed during the sputter deposition. The polycrystalline silicon film results from annealing the low hydrogen content amorphous silicon film thus formed.

20 Claims, 6 Drawing Sheets

SYSTEM AND METHOD FOR SPUTTERING SILICON FILMS USING HYDROGEN GAS MIXTURES

BACKGROUND OF THE INVENTION

1. Field of the Invention

This invention generally relates to the fabrication of integrated circuits and, more particularly, to a system and method for forming polysilicon (p-Si) films from the sputter deposition of amorphous Si (a-Si) using an Argon (Ar)-Hydrogen ($H_2$) gas mixture.

2. Description of the Related Art

Amorphous Si thin films are used in the fabrication of polycrystalline silicon thin film transistors (TFTs), which in turn are a key element in active matrix (AM) type liquid crystal displays (LCDs).

Sputtering is a well-known conventional process suited to the formation of the various Si-based, TFT layers because:

1. It is a safe and environmentally benign technique;
2. It can be used even at room temperature. Hence, it is compatible with any kind of substrate;
3. Silicon films with very low $H_2$ content can be deposited by this method. Hence, there is no need for dehydrogenation to release excessive hydrogen. Alternatively, hydrogen can be incorporated into the film if, and when, necessary; and
4. It is a simpler and a more easily scaled method than comparable methods that rely upon chemistry.

For improved electrical performance it is desirable that the deposited amorphous silicon film be converted, typically by annealing, into a microcrystalline or polycrystalline Si film. There are many processes known in the art to form polycrystalline silicon (polysilicon) from amorphous silicon.

It is known to use a large amount of hydrogen in the Ar gas in the sputtering deposition process for applications such as deposition of hydrogenated a-Si:H films used in amorphous silicon solar cells or amorphous silicon LCDs. In these films, $H_2$ termination of Si dangling bonds is necessary to achieve desired film characteristics. However, the use of hydrogen in the sputtering deposition process is not conventionally known to improve the electrical characteristics of the polycrystalline silicon film formed by this method.

FIGS. 1a through 1e are partial cross-sectional diagrams illustrating the fabrication of a conventional top-gate TFT structure (prior art). Poly-Si (polycrystalline-Si) TFTs are made by a plurality of processes. In the majority of polycrystalline silicon TFT LCD applications, the so-called top-gate, polycrystalline silicon TFT structure is used. Typically, Plasma-Enhanced Chemical Vapor Deposition (PE-CVD) or Low-Pressure CVD (LPCVD) is used to deposit the amorphous silicon precursor. However, there are several advantages in using physical vapor deposition (PVD) or sputtering to form the silicon film. Such advantages are a reduction in process steps, since there is no need for dehydrogenation, a reduction in equipment costs, and improved process safety, since no toxic/pyrophoric gases are necessary.

Figure 1A:
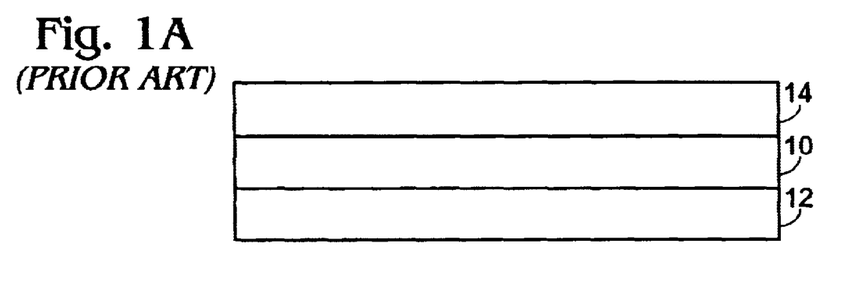
FIGS. 1a through 1e are partial cross-sectional diagrams illustrating the fabrication of a conventional top-gate TFT structure (prior art).

In FIG. 1a a barrier layer 10 is deposited over a substrate 12. Amorphous Si 14 is deposited over barrier layer 10.

Figure 1B:
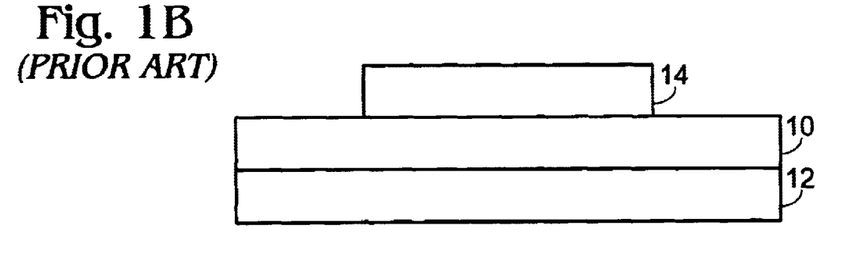

In FIG. 1b the silicon layer 14 is annealed, using an Excimer Laser for example, to form polycrystalline silicon layer 14. Then, the polycrystalline silicon layer 14 is patterned and dry etched.

Figure 1C:
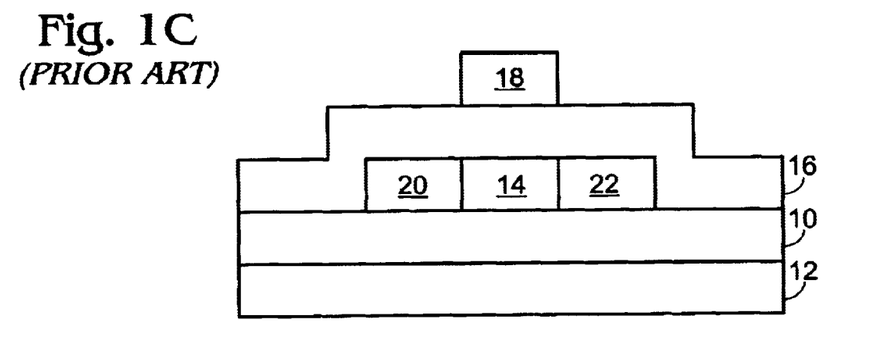

In FIG. 1c a gate isolation layer 16 is formed over the polycrystalline silicon layer 14. A gate 18 is formed over gate isolation layer 16, and the source region 20 and drain region 22 are implanted with P material.

Figure 1D:
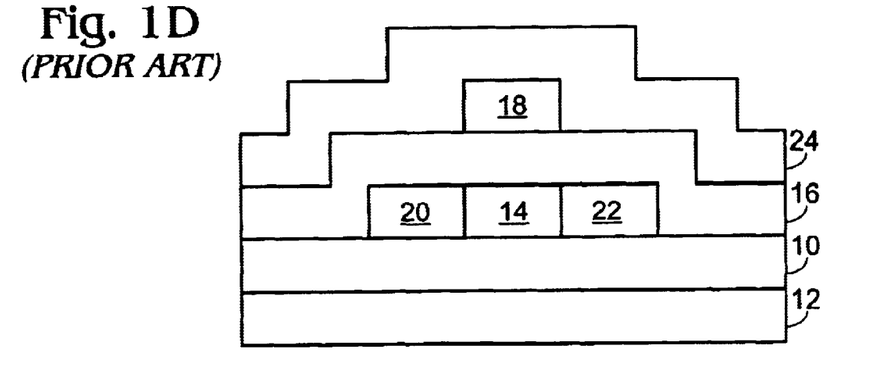

In FIG. 1d an interlayer dielectric 24 is isotropically deposited.

Figure 1E:
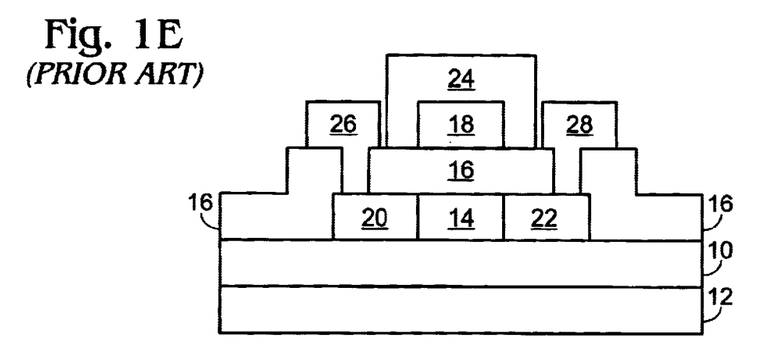

In FIG. 1e the interlayer dielectric 24 is selectively etched to form vias to the source/drain regions 20/22. A source contact 26 and a drain contact 28 are deposited and patterned. The present invention is concerned with the sputter deposition of the amorphous silicon used to form polycrystalline silicon layer 14 (FIG. 1a).

Figure 2:
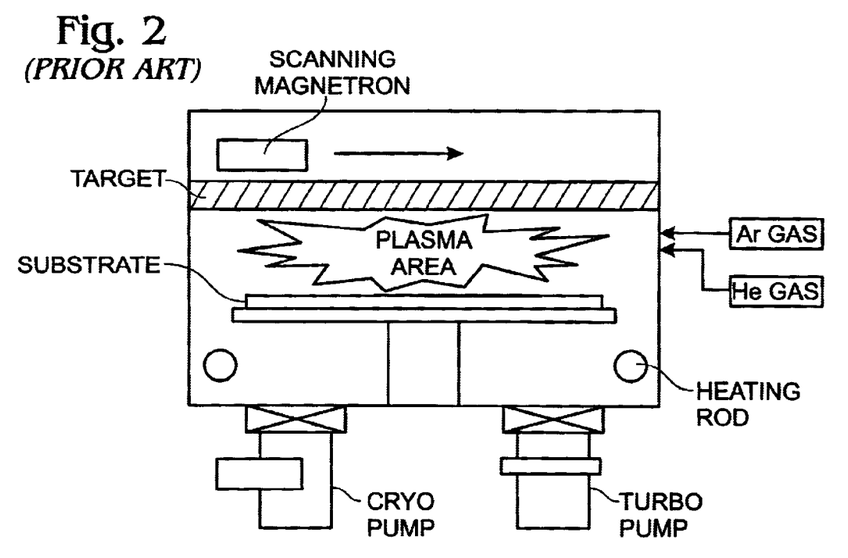
FIG. 2 is a partial cross-sectional diagram of a typical DC magnetron sputtering chamber (prior art).

FIG. 2 is a partial cross-sectional diagram of a typical DC magnetron sputtering chamber (prior art). One of the key aspects of the Si-sputtering process is the 'target' component. The target is a block of the material to be deposited, mounted on an appropriate metal backing plate, and placed opposite to the substrate where the film is to be deposited. Plasma strikes in the gap between the target and the substrate. The magnet that is scanning above the target backing plate is used to intensify the plasma and confine it in the region defined by the magnetic field. By scanning the magnet, the plasma is swept across the surface of the target, resulting in deposition of the film on the substrate opposite to the target. The plasma is generated by applying high voltage to an inert gas (typically Ar, but alternately He, Ne, Kr or mixtures) that flows in the region between the target and the substrate. For certain applications, other gases may be mixed to the sputtering gas, such as $H_2$, $O_2$, $N_2$, etc., to alter the composition and/or the properties of the sputtered film.

It would be advantageous if a process existed for improving the electrical characteristics associated with an amorphous silicon film deposited by sputtering.

It would be advantageous if a process existed for improving the sheet resistance of polycrystalline silicon film, annealed from a sputter deposited amorphous silicon film.

It would be advantageous if the above-mentioned polycrystalline silicon film could be fabricated using easily controlled process steps and inert materials.

SUMMARY OF THE INVENTION

Accordingly, a method is provided for forming a polycrystalline silicon (p-Si) film in an integrated circuit (IC) fabrication process. The method comprises: sputtering amorphous silicon (a-Si) material on a substrate; supplying an Ar gas mixture including a hydrogen content of no more than 4% volume (in the gas feed); forming an amorphous silicon film incorporating hydrogen; annealing the amorphous silicon film using a rapid thermal annealing or Excimer laser process; and, forming a polycrystalline silicon film having a crystalline content in the range from 95 percent (%) to 100%, as measured by Raman Spectroscopy or equivalent measurement means, and a hydrogen content in the range from 1% atomic weight (at %) to 3 at %.

Also provided is a polysilicon (p-Si) film, such as might be used in the fabrication of a thin film transistor (TFT). The polycrystalline silicon film comprises a pre-anneal amorphous silicon (a-Si) film having a content of no more than 4% hydrogen, by atomic weight, and a post-anneal polycrystalline silicon film having a crystalline content in the range from 95% to 100%, and a hydrogen content in the range from 1 at % to 3 at %.

Additional details of the polycrystalline silicon film, polycrystalline silicon film fabrication process, and a pre-anneal film are provided below.

DETAILED DESCRIPTION OF THE PREFERRED EMBODIMENTS

Figure 3:
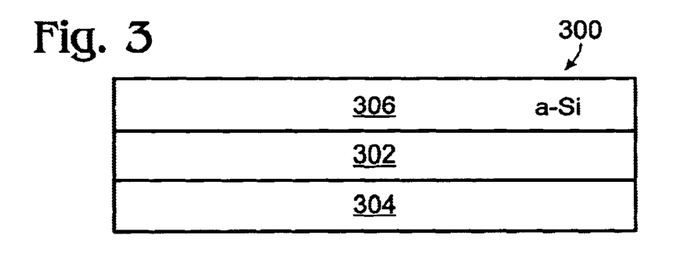
FIG. 3 is a partial cross-sectional view of a pre-anneal film used in the fabrication of a thin film transistor (TFT).

FIG. 3 is a partial cross-sectional view of a pre-anneal film used in the fabrication of a thin film transistor (TFT) 300. Such a transistor might be, in turn, used in the fabrication of an LCD panel. As in FIG. 1a, a barrier layer 302 is deposited over a substrate 304. Amorphous Si 306 is deposited over barrier layer 302. Alternately, the silicon layer 306 is formed over others materials (not shown), as FIG. 3 is only one example process. The amorphous silicon film 306 has been formed so that it has a small hydrogen content. Specifically, the amorphous silicon film 306 has no more than 4% hydrogen content in the amorphous silicon, by atomic weight. Even more specifically, the hydrogen content is in the range from 0.1 percent by atomic weight (at %) to 4 at %. In other aspects of the invention the hydrogen content is in the range from 1 at % to 4 at %, or in the range from 3 at % to 4 at %. The percentage is varied to achieve differences in the resultant film characteristics.

Figure 4:
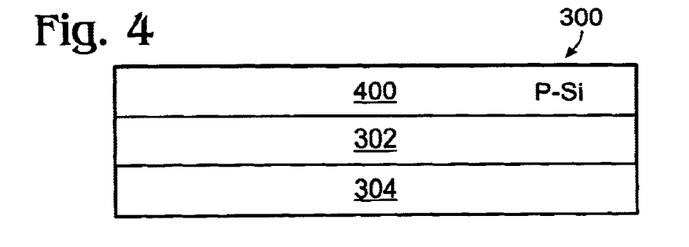
FIG. 4 is a partial cross-sectional view of the TFT transistor of FIG. 3 following an annealing process.

FIG. 4 is a partial cross-sectional view of the TFT 300 transistor of FIG. 3 following an annealing process. Following annealing, the amorphous silicon film is transformed into a post-anneal polycrystalline silicon film 400 having a crystalline content in the range from 95% to 100%, and a hydrogen content in the range from 1 at % to 3 at %.

The present invention is concerned with a Si sputtering using mainly Ar gas, with the addition of a small percentage of $H_2$. The present invention discloses an amorphous silicon film including 0.1 at % to 4 at % $H_2$. Amorphous Si film, with $H_2$ content in the range of 0.1–4 at %, is initially deposited and the crystallized via an annealing step to yield polycrystalline silicon. The annealing step can be conducted by a rapid thermal annealing method, by Excimer laser annealing, or by equivalent methods known in the art. The low hydrogen content in the film enables a better microstructure that responds favorably to the annealing process, and yields a lower defect-density crystalline network. In the complete absence of hydrogen, physical vapor deposition (PVD) Si films are more difficult to crystallize by thermal-processes, and tend to generate more film defects, even after laser crystallization. This implies that the expected electrical performance of PVD-Si films formed by only Ar may be inferior to that of PVD-Si films formed by Ar—$H_2$ mixture.

Figure 5:
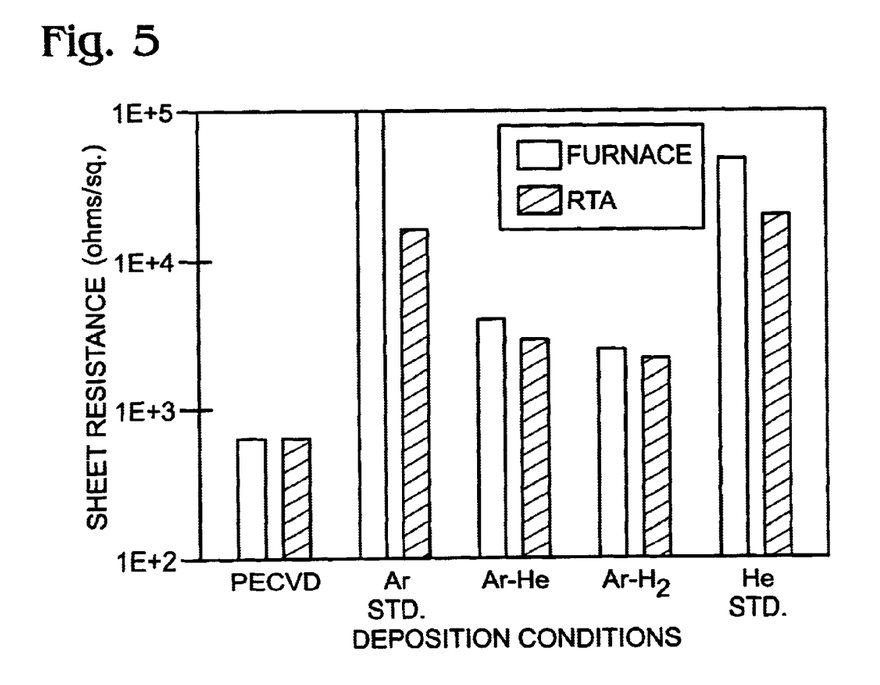
FIGS. 5 and 6 are graphs comparing the sheet resistance of PVD-Si films as a function of the gas mixture used for their formation.
Figure 6:
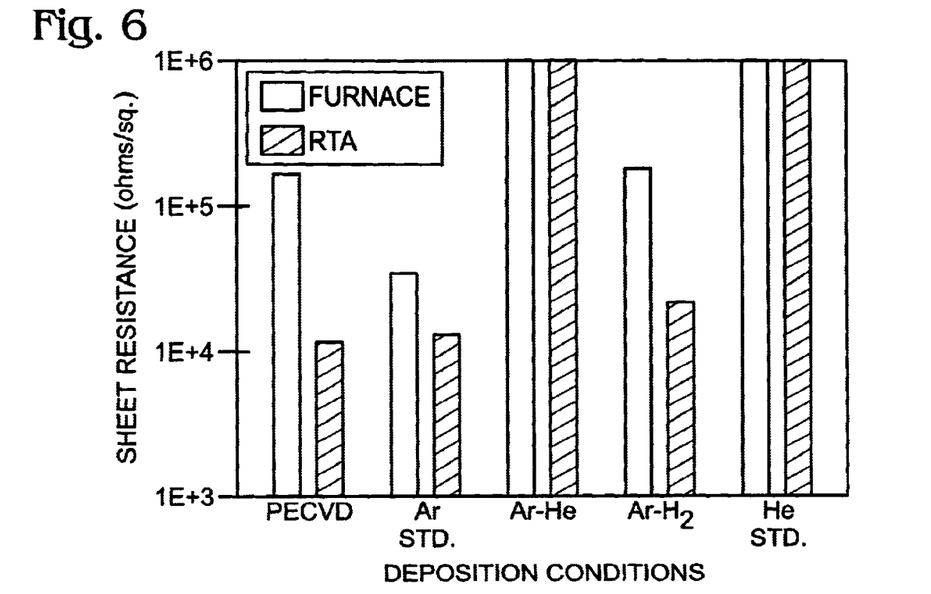

FIGS. 5 and 6 are graphs comparing the sheet resistance of PVD-Si films as a function of the gas mixture used for their formation. The sheet resistance was obtained after implantation of either phosphorus (FIG. 5) or boron (FIG. 6). Both furnace and rapid thermal anneal (RTA) activation were used for comparison. The PVD-Si films were formed by sputtering with pure Ar (Ar std), a mixture of Ar—He gas, a mixture of Ar—$H_2$ gas, and pure He (He std). These results are compared to a plasma-enhanced chemical vapor deposition (PECVD) process.

FIGS. 5 and 6 demonstrate that the PVD-Si films deposited with Ar—$H_2$ gas have a sheet resistance range comparable to that of the PECVD-Si films (reference samples). This finding suggests that for the crystallization of amorphous silicon, or for source-drain activation, Ar—$H_2$ sputtering may be a more desirable process that pure Ar sputtering.

Thus, a gas mixture of Ar with 4% hydrogen by volume, or 4% hydrogen as measured by volume in the gas feed supplying the gas to the deposition chamber, is used as the sputtering gas in the present invention deposition of amorphous silicon film. The advantage of 4% $H_2$ in Ar gas is that it can be treated as inert, not requiring special handling and storage. Since the gas is easy to control, the correct amount of hydrogen can be incorporated into the film. Although the graphs show the results of a small amount of hydrogen mixed with Ar, the present invention concept will be equally applicable to the mixing of a small amount of hydrogen with other gases commonly used for sputter deposition, such as He, Ne, Kr, and mixtures of these gases. However, these other gas mixtures may require a different percentage of hydrogen in the mixture to achieve the same results as described above.

Figure 7:
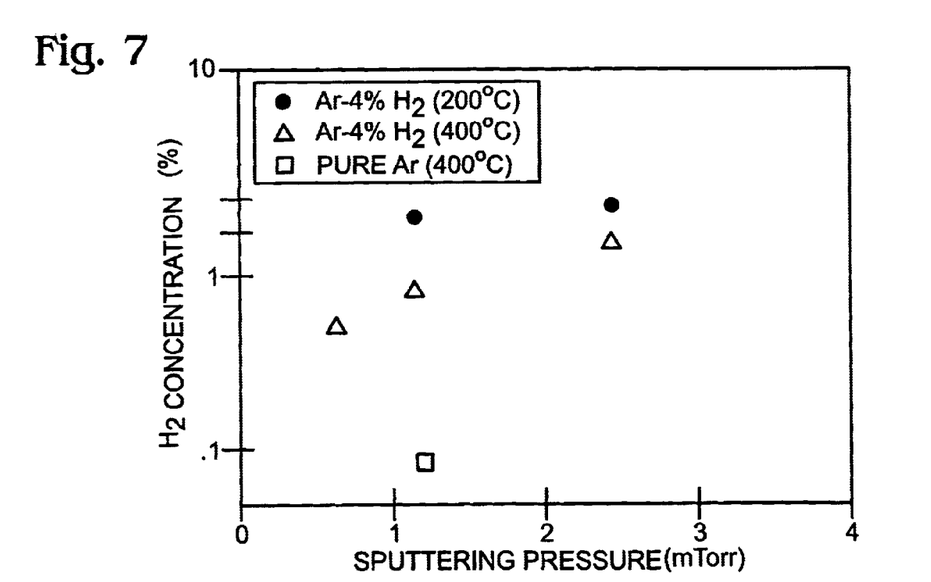
FIG. 7 is a graph illustrating the relationship between the amount of hydrogen in the sputter deposition gas and the resulting hydrogen in the deposited film.

FIG. 7 is a graph illustrating the relationship between the amount of hydrogen in the sputter deposition gas and the resulting hydrogen in the deposited film. The control of the $H_2$ incorporation is accomplished by adjusting the process temperature and/or the process pressure (gas flow). The incorporation of $H_2$ decreases at higher process temperatures, as $H_2$ tends to readily desorb at process temperatures higher than about 300 degrees C. Thus, by controlling the hydrogen in the gas feed and the range of process temperatures in the range of 200 degrees C. to 400 degrees C., an amorphous silicon film with a hydrogen content in the range of 0.1–4 at % (percentage by atomic weight) can be realized.

Figure 8:
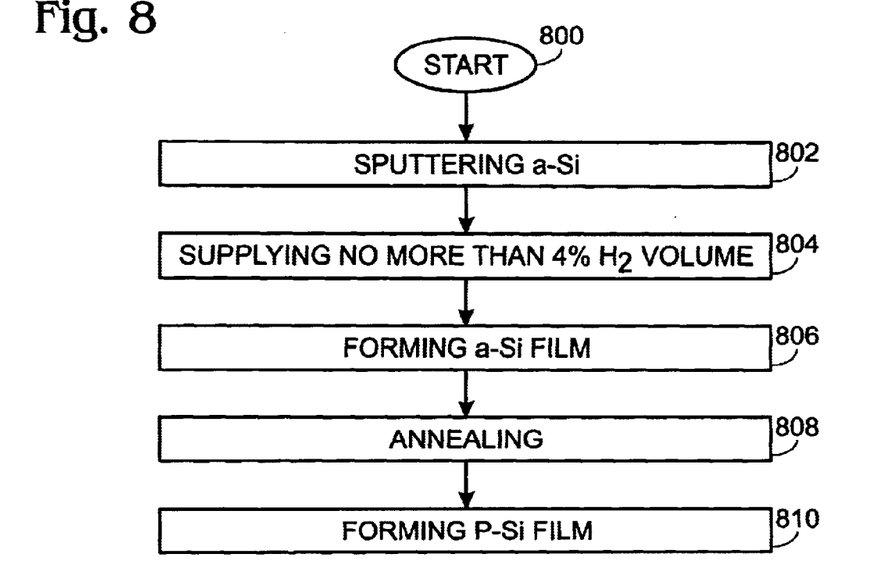
FIG. 8 is a flowchart illustrating a method for forming a polycrystalline silicon (p-Si) film in an IC fabrication process.

FIG. 8 is a flowchart illustrating a method for forming a polycrystalline silicon (p-Si) film in an IC fabrication process. Although the method is depicted as a sequence of numbered steps for clarity, no order should be inferred from the numbering unless explicitly stated. The method begins at Step 800. Step 802 sputters amorphous silicon (a-Si) material on a substrate. Sputtering amorphous silicon (a-Si) material on a substrate in Step 802 includes setting the process temperature to be in the range from 200 degrees C. to 400 degrees C. Step 804 supplies a gas mixture including a hydrogen content of no more than 4% volume in the gas feed. Step 806 forms an amorphous silicon film incorporating hydrogen. Step 808 anneals the amorphous silicon film. Step 810 forms a polycrystalline silicon film having a crystalline content in the range from 95% to 100% and a hydrogen content in the range from 1 at % to 3 at %.

Figure 9:
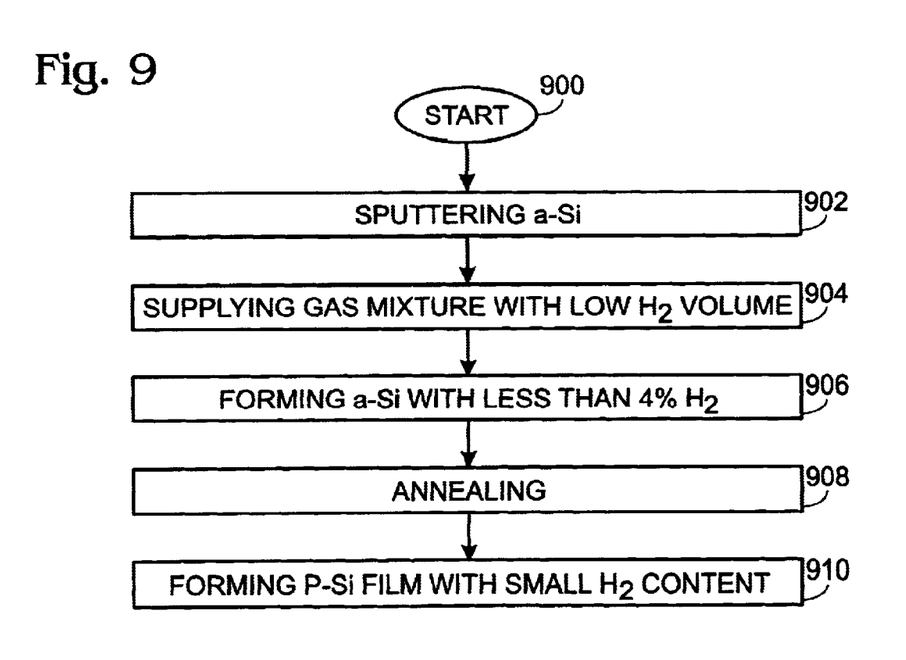
FIG. 9 is a flowchart illustrating another method for forming a polycrystalline silicon film in an IC fabrication process.

FIG. 9 is a flowchart illustrating another method for forming a polycrystalline silicon film in an IC fabrication process. The method begins at Step 900. Step 902 sputters amorphous silicon (a-Si) material on a substrate. Sputtering amorphous silicon (a-Si) material on a substrate in Step 902 includes setting the process temperature in the range from 200 degrees C. to 400 degrees C. Step 904 supplies a gas mixture having a low hydrogen volume at the gas feed. Step 906 forms an amorphous silicon film incorporating no more than 4% hydrogen, by atomic weight. Step 908 anneals the amorphous silicon film. Step 910 forms a polycrystalline silicon film having a crystalline content in the range from 95% to 100% and a hydrogen content in the range from 1 at % to 3 at %.

Figure 10:
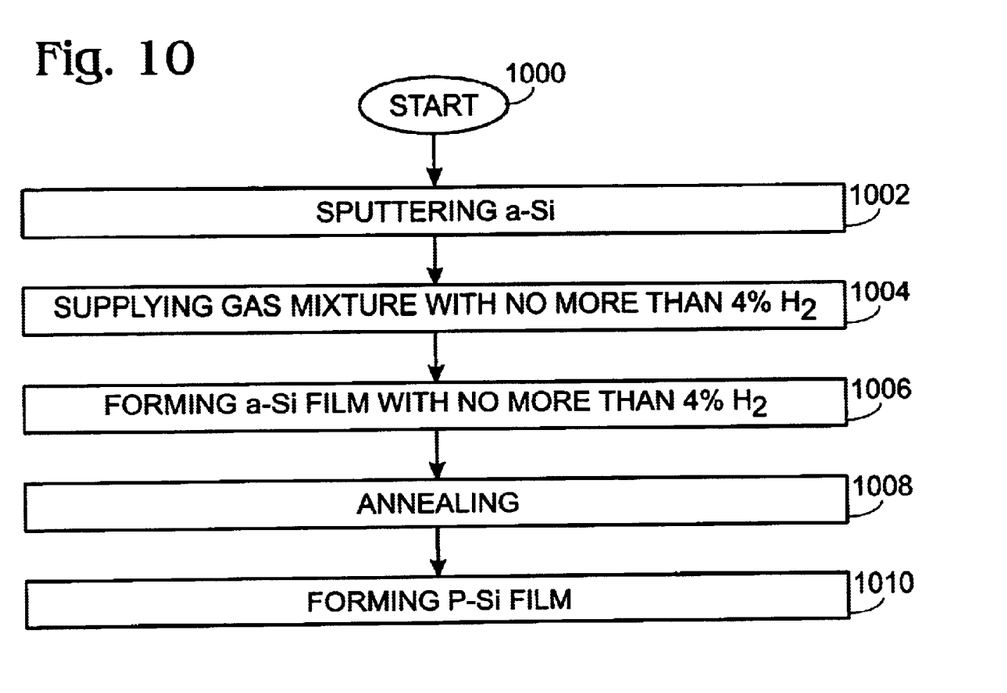
FIG. 10 is a flowchart illustrating yet another method for forming a polycrystalline silicon film in an IC fabrication process.

FIG. 10 is a flowchart illustrating yet another method for forming a polycrystalline silicon film in an IC fabrication process. The method begins at Step 1000. Step 1002 sputters amorphous silicon material on a substrate. Sputtering amorphous silicon material on a substrate includes setting the process temperature to be in the range from 200 degrees C. to 400 degrees C. Step 1004 supplies a gas mixture including no more than 4% hydrogen volume in the gas feed. In some aspects of the invention supplying a gas mixture including no more than 4% hydrogen volume in the gas feed in Step 1004 includes supplying a gas mixture substantially including Ar, mixed with no more than 4% hydrogen. Alternately, the gas mixture includes hydrogen in the range from 0.1% to 4%. Other inert gases, besides Ar, would yield equivalent results.

Step 1006 forms an amorphous silicon film incorporating no more than 4% hydrogen, by atomic weight. In some aspects forming an amorphous silicon film incorporating no more than 4% hydrogen, by atomic weight includes forming an amorphous silicon film having hydrogen content in the range from 0.1% to 4%, by atomic weight. Alternate ranges include hydrogen content in the range from 1% to 4%, or hydrogen content in the range from 3% to 4%, by atomic weight.

Step 1008 anneals the amorphous silicon film. Annealing the amorphous silicon film includes annealing with a process selected from the group including rapid thermal annealing (RTA) and Excimer laser annealing (ELA). In some aspects Step 1008 rapid thermal anneals (RTA) at a temperature greater than approximately 600 degrees C. Alternately, the rapid thermal annealing temperature is in the range from 600 degrees C. to 900 degrees C. Step 1010 forms a polycrystalline silicon film as described above.

In some aspects of the invention Step 1006 includes forming an amorphous silicon film incorporating hydrogen content in the range from 3% to 4%, by atomic weight. Then, Step 1008 rapid thermal anneals at a temperature in the range from 600 degrees C. to 900 degrees C.

A polycrystalline silicon film with a small amount of hydrogen, and a method for forming such a polycrystalline silicon film have been provided. The polycrystalline silicon film of the present invention is immediately applicable to amorphous silicon and polycrystalline silicon TFT devices in an LCD panel. However, the process will have uses in other, more general, and unspecified IC fabrication process. Variations and other embodiments of the invention will occur to those skilled in the art.

We claim:

1. In an integrated circuit (IC) fabrication process, a method for forming a polycrystalline silicon (p-Si) film, the method comprising:

sputtering amorphous silicon (a-Si) material on a substrate;

supplying a gas mixture including a hydrogen content of no more than 4% volume in the gas feed;

forming an amorphous silicon film incorporating hydrogen;

annealing the amorphous silicon film; and forming a polycrystalline silicon film.

2. The method of claim 1 wherein forming a polycrystalline film includes forming a film having a crystalline content in the range from 95% to 100% and a hydrogen content in the range from 1 percent by atomic weight (at %) to 3 at %.

3. The method of claim 1 wherein sputtering amorphous silicon material on a substrate includes setting the process temperature to be in the range from 200 degrees C. to 400 degrees C.

4. In an integrated circuit (IC) fabrication process, a method for forming a polycrystalline silicon (p-Si) film, the method comprising:

sputtering amorphous silicon (a-Si) material on a substrate;

supplying a gas mixture having a low hydrogen volume at the gas feed;

forming an amorphous silicon film incorporating no more than 4% hydrogen, by atomic weight;

annealing the amorphous silicon film; and forming a polycrystalline silicon film having a hydrogen content in the range from 1 percent by atomic weight (at %) to 3 at %.

5. The method of claim 4 wherein forming a polycrystalline film includes forming a film with a crystalline content in the range from 95% to 100%.

6. The method of claim 4 wherein sputtering amorphous silicon material on a substrate includes setting the process temperature in the range from 200 degrees C. to 400 degrees C.

7. In an integrated circuit (IC) fabrication process, a method for forming a polycrystalline silicon (p-Si) film, the method comprising:

sputtering amorphous silicon (a-Si) material on a substrate;

supplying a gas mixture including no more than 4% hydrogen volume in the gas feed;

forming an amorphous silicon film incorporating no more than 4% hydrogen, by atomic weight.

8. The method of claim 7 wherein supplying a gas mixture including no more than 4% hydrogen volume in the gas feed includes supplying a gas mixture substantially including Ar, mixed with no more than 4% hydrogen.

9. The method of claim 7 wherein supplying a gas mixture including no more than 4% hydrogen volume in the gas feed includes supplying a gas mixture including hydrogen in the range from 0.1% to 4%.

10. The method of claim 7 wherein forming an amorphous silicon film incorporating no more than 4% hydrogen, by atomic weight includes forming an amorphous silicon film having hydrogen content in the range from 0.1% to 4%, by atomic weight.

11. The method of claim 10 wherein forming an amorphous silicon film incorporating no more than 4% hydrogen, by atomic weight includes forming an amorphous silicon film having hydrogen content in the range from 1% to 4%, by atomic weight.

12. The method of claim 11 wherein forming an amorphous silicon film incorporating no more than 4% hydrogen, by atomic weight includes forming an amorphous silicon film having hydrogen content in the range from 3% to 4%, by atomic weight.

13. The method of claim 7 further comprising:

annealing the amorphous silicon film; and forming a polycrystalline silicon film.

14. The method of claim 13 wherein annealing the amorphous silicon film includes annealing with a process selected from the group including rapid thermal annealing (RTA) and Excimer laser annealing (ELA).

15. The method of claim 13 wherein annealing the amorphous silicon film includes rapid thermal annealing at a temperature greater than approximately 600 degrees C.

16. The method of claim 13 wherein annealing the amorphous silicon film includes rapid thermal annealing at a temperature in the range from 600 degrees C. to 900 degrees C.

17. The method of claim 13 wherein forming an amorphous silicon film incorporating no more than 4% hydrogen, by atomic weight includes forming an amorphous silicon film incorporating hydrogen content in the range from 3% to 4%, by atomic weight; and wherein annealing the amorphous silicon film includes rapid thermal annealing at a temperature in the range from 600 degrees C. to 900 degrees C.

18. The method of claim 7 wherein sputtering amorphous silicon amorphous silicon material on a substrate includes setting the process temperature to be in the range from 200 degrees C. to 400 degrees C.

19. In an integrated circuit (IC) fabrication process, a method for forming a polycrystalline silicon (p-Si) film, the method comprising:

sputtering amorphous silicon (a-Si) material on a substrate;

supplying a gas mixture including a hydrogen content of no more than 4% volume in the gas feed;

forming an amorphous silicon film incorporating hydrogen;

annealing the amorphous silicon film; and forming a polycrystalline silicon film having a crystalline content in the range from 95% to 100% and a hydrogen content in the range from 1 percent by atomic weight (at %) to 3 at %.

20. In an integrated circuit (IC) fabrication process, a method for forming a polycrystalline silicon (p-Si) film, the method comprising:

sputtering amorphous silicon (a-Si) material on a substrate;

supplying a gas mixture having a low hydrogen volume at the gas feed;

forming an amorphous silicon film incorporating no more than 4% hydrogen, by atomic weight;

annealing the amorphous silicon film; and forming a polycrystalline silicon film having a crystalline content in the range from 95% to 100% and a hydrogen content in the range from 1 percent by atomic weight (at %) to 3 at %.

* * * * *